United States Patent
Tzeng et al.

[11] Patent Number: 6,153,061
[45] Date of Patent: Nov. 28, 2000

[54] METHOD OF SYNTHESIZING CUBIC BORON NITRIDE FILMS

[75] Inventors: Yonhua Tzeng, Auburn, Ala.; Hongbin Zhu, Fremont, Calif.

[73] Assignee: Auburn University, Auburn, Ala.

[21] Appl. No.: 09/257,572

[22] Filed: Feb. 25, 1999

Related U.S. Application Data

[60] Provisional application No. 60/076,532, Mar. 2, 1998.

[51] Int. Cl.[7] .................................................. C23C 14/34
[52] U.S. Cl. ................. 204/192.16; 204/192.15; 204/192.22; 204/192.32; 204/192.35; 204/298.12; 204/298.13; 204/298.06; 204/192.11; 204/298.04; 204/298.07; 204/298.19
[58] Field of Search ........................ 204/192.15, 192.16, 204/192.22, 192.32, 192.35, 298.12, 298.13, 298.06, 192.11, 298.04, 298.07, 298.19

[56] References Cited

U.S. PATENT DOCUMENTS

| | | | |
|---|---|---|---|
| 4,412,899 | 11/1983 | Beale | 204/192.11 |
| 4,415,420 | 11/1983 | Beale | 204/192.15 |
| 4,655,893 | 4/1987 | Beale | 204/192.15 |
| 4,683,043 | 7/1987 | Melton et al. | 204/192.15 |
| 5,096,740 | 3/1992 | Nakagama et al. | 427/586 |
| 5,137,772 | 8/1992 | Watanabe et al. | 428/212 |
| 5,279,869 | 1/1994 | Doll et al. | 427/586 |
| 5,316,804 | 5/1994 | Tomikawa et al. | 427/569 |
| 5,326,424 | 7/1994 | Doll et al. | 117/105 |
| 5,330,611 | 7/1994 | Doll | 117/105 |
| 5,483,920 | 1/1996 | Pryor | 117/106 |
| 5,503,913 | 4/1996 | König et al. | 428/216 |

FOREIGN PATENT DOCUMENTS

| | | |
|---|---|---|
| 1-246357 | 10/1989 | Japan . |
| 3-211268 | 9/1991 | Japan . |

OTHER PUBLICATIONS

Tsuda et al., "Preparation of cubic boron nitride by radio frequency bias sputtering," J. Vac. Sci. Technol. A, 13(6), Nov. 1995.

Ulrich et al., "Preparation of cubic boron nitride films by radio frequency magnetron sputtering and radio frequency ion plating," Appl. Phys. Lett., 68(7), Feb. 1996.

Preparation of cubic boron nitride films by radio frequency bias sputtering, Osamu Tsuda, et al., *J. Vac. Sci. Technol.*, A13(6), Nov./Dec. 1995.

Ion–assisted pulsed laser deposition of cubic BN films on Si (001) substrates, A.K. Ballah et al., *J. Mater. Res.*, vol. 7, No. 7, Jul. 1992.

Formation of cubic boron nitride films by arc–like plasma–enhanced ion plating method, *J. Vac. Sci. Technol.*, A 8(4), Jul./Aug. 1990.

(List continued on next page.)

*Primary Examiner*—Alan Diamond
*Attorney, Agent, or Firm*—Womble Carlyle Sandridge & Rice, PLLC

[57] ABSTRACT

A method of forming cubic phase boron nitride films in which a hexagonal boron nitride film target is positioned in front of an RF magnetron sputtering gun and is impacted with ions to cause atoms of boron and nitrogen to be sputtered away from the target and toward a substrate. At the same time, electrons are emitted into the system by an electron emitter, which electrons are attracted to the substrate as the boron and nitrogen atoms are being deposited on the substrate. The electrons cause the boron and nitrogen atoms to be reformed on the substrate as cubic phase boron nitride while suppressing the formation of other, less desirable forms of boron nitride films.

13 Claims, 4 Drawing Sheets

OTHER PUBLICATIONS

High pressure phases of boron nitride grown by laser–assisted plasma chemical vapor deposition from $BCl_3+NH_3+H_2+Ar$, Shojiro Komatsu et al., *J. Appl. Phys.*, 70 (11), Dec. 1, 1991.

Textured growth of cubic boron nitride film on nickel substrates, *Appl. Phys. Lett*, 65 (21), Nov. 21, 1994.

Phase control of cubic boron nitride thin films, Daniel J. Kester et al., *J. Appl. Phys.*, 72(2), Jul. 15, 1992.

Preparation of cubic boron nitride film by activated reactive evaporation with a gas activation nozzle, K. Inagawa, et al, *J. Vac. Sci. Technol.*, A 5(40), Jul./Aug. 1987.

Direct Transformation of Hexagonal Boron Nitride to Denser Forms, F. P. Bundy et al., *The Journal of Chemical Physics*, vol. 38, No. 5, Oct. 18, 1962.

Preparation of cubic boron nitride films by radio frequency magnetron sputtering and radio frequency ion plating, S. Ulrich, et al., *Appl. Phys. Lett.*, 68 (7), Feb. 12, 1996.

The Synthesis of Cubic BN Films Using a Hot Cathode Plasma Discharge in a Parallel Magnetic Field, M. Murakawa et al., *Surface and Coatings Technology*, 43/44 (1990) (month unknown).

Amorphous Hydrogenated Carbon Films: Deposition and Characterization, Jayshree Seth, et al., *International Conference on Beam Processing of Advanced Materials*, The Minerals, Metals & Materials Society, 1993 (month unknown).

Laser Deposition of Cubic Boron Nitride and Diamond Coatings, G. L. Doll et al., *International Conference on Beam Processing of Advanced Materials*, The Minerals, Metals & Materials Society, 1993 (month unknown).

METHOD OF SYNTHESIZING CUBIC BORON NITRIDE FILMS

CROSS REFERENCE TO PRIORITY APPLICATION

This application claims priority to U.S. Provisional Patent Application Serial No. 60/076,532, filed Mar. 2, 1998, expired entitled METHOD OF SYNTHESIZING CUBIC BORON NITRIDE FILMS.

FIELD OF THE INVENTION

The present invention relates to a method of synthesizing cubic boron nitride. In particular, the present invention provides a method of synthesizing cubic boron nitride Is using RF sputtering of a hexagonal boron nitride target so as to release atoms of boron and nitrogen directed toward a substrate. The substrate is simultaneously bombarded with electrons to enhance the synthesis of cubic boron nitride on the substrate while at the same time suppressing the synthesis of other, less desirable phases of boron nitride.

BACKGROUND OF THE INVENTION

There has been increasing interest in the synthesis of crystalline films such as diamond films for use in coating applications and for applying to cutting and polishing tools. The development and synthesis of cubic boron nitride ("cBN") films has become of particular interest in recent years due to cBN being physically and structurally superior to diamond. cBN has a high relative hardness and wear resistance that is similar to diamond, but also has a high thermal stability in the presence of oxygen and a chemical inertness to ferrous materials, especially at higher temperatures which are not found in diamonds. Thus, cBN films have become highly desirable for use in coating applications that require exposure to high temperatures and highly oxidizing environments, as well as for applications to cutting and polishing tools for cutting ferrous materials and alloys due to their high thermal stability and chemical inertness to ferrous materials. In fact, bulk cBN is widely used for cutting tool inserts and as protective coatings to improve machining precision and to extend the life span of cutting and grinding tools significantly as well as for hard protective coatings for power electronic devices and optical systems for use in harsh environments. In addition, the high thermal conductivity of cBN also makes it an excellent material for use as a heat sink and for insulating materials.

cBN films are typically formed using deposition techniques for the deposition of thin films of boron nitride on a substrate. Such deposition techniques include physical vapor deposition techniques such as ion beam deposition, ion assisted pulsed laser deposition, and RF sputtering; and chemical vapor deposition techniques including plasma enhanced chemical vapor deposition, such as microwave electron cyclotron resonance, inductively coupled RF plasma enhanced chemical vapor deposition and hot filament enhanced chemical vapor deposition, and field emission electron enhanced chemical vapor deposition. Most of these deposition techniques, including RF sputtering, rely on energetic ion bombardment as a key for formation of cBN at low pressures. In such processes, atoms of boron and nitrogen are directed at a substrate while at the same time, the substrate is bombarded with ions to cause the boron and nitrogen atoms to reform on the substrate in a cubic boron nitride film.

With most of these synthesizing deposition techniques, however, it has been difficult to obtain pure or near 100% cubic phase boron nitride films using such techniques, and those that have produced high purity cubic phase boron nitride films have generally required the use of energetic ion bombardment of the substrate on which the cubic boron nitride film is deposited. The problem with such energetic ion bombardment of the substrate is that it limits the grain size of the cubic boron nitride films formed to nanocrystalline films which have a limited grain size. In addition, using ion bombardment creates a problem of resputtering of the boron and nitrogen atoms away from the substrate after a certain size film has been formed, further limiting the size and purity of the films. The ions bombarding the substrate and thus the boron nitride crystalline film generally have a relatively large mass and as they strike the film, the momentum transfer between the ions and the film reaches a point as the film is built up to a sufficient mass where the momentum transfer from the ions is sufficient to repel the boron and nitrogen atoms instead of attracting the boron and nitrogen atoms to the substrate.

As a result, large crystalline structure growth of cubic phase boron nitride films is inhibited and at some point stopped as the crystalline structure of the film reaches a certain size due to this resputtering effect of the ions striking the film. Thus, conventional synthesizing or deposition techniques for forming cubic phase boron nitride films that utilize ion bombardment generally provide only a limited window of growth for the crystalline films and typically are unable to provide pure or near pure cubic phase boron nitride films of high quality and having sufficiently large grain sizes desired for many applications for such films.

It therefore can be seen that a need exists for a method of synthesizing cubic boron nitride films that enables high growth rates and the formation of cubic phase boron nitride films of high purity, quality and larger grain sizes rapidly and economically without potentially damaging the films during formation due to a resputtering effect of the ion bombardment against the films.

SUMMARY OF THE INVENTION

Briefly described, the present invention relates to a method of synthesizing cubic boron nitride films ("cBN") that enables the rapid growth of high quality and near 100% purity films. In the method of the present invention, a target of a hexagonal boron nitride film ("hBN") is positioned in front of a magnetron sputtering gun mounted within a vacuum chamber containing nitrogen gas supplied under pressure between 1–55 mtorr. The magnetron sputtering gun is connected to a radio frequency (RF) power supply through which ions are supplied through the magnetron sputtering gun in an excited plasma at approximately 13.56 MHz. The sputtering gun bombards the hBN target with the ions causing the boron and nitrogen atoms to be sputtered out of their hexagonal phase and directed toward a substrate positioned in front of the hBN target.

The substrate generally is sheet or wafer of silicon, typically having been etched in a hydrogen fluoride solution to remove any native dioxides therefrom prior to the deposition process. Typically, the substrate is mounted at a distance from the hBN target sufficient to insure that the boron and nitrogen atoms will strike the substrate as they are sputtered from the hBN target. In experiments using the method of the present invention, a distance of approximately 5 cm. between the substrate and hBN target was used. A hot tungsten filament is positioned outside the RF magnetron discharge zone, adjacent the sputtering gun and substrate. The tungsten filament is connected to a DC power supply which supplies a current that is passed through the tungsten filament and the substrate, with the current density at the substrate being in a range of approximately 0–400 mAmp/cm$^2$. As current is passed through the tungsten filament, the filament is heated which causes electrons to be emitted from the tungsten filament into the vacuum chamber. The electrons are attracted to and bombard the substrate, generally causing the substrate to be heated to approximately 700°–950° C., or higher temperatures.

As the electrons bombard the substrate, the boron and nitrogen atoms impact and collect on the substrate. The striking of the substrate with the electrons causes the boron and nitrogen atoms on the substrate to reform in their cubic phase while suppressing the formation of hexagonal phase boron nitride so as to prevent the boron and nitrogen atoms from reforming in their hexagonal phase.

In experiments conducted using this method, approximately 100% pure cubic phase boron nitride films were deposited on silicon substrates, having a film thickness of between 90–350 nanometers at a growth rate of 5–15 nanometers per minute over a 1–3 hour period. The quality of the films was dependent on the electron current density of the electrons bombarding the substrate, the temperature of the substrate, and the pressure of the nitrogen atmosphere within the vacuum chamber, with between 90%–100% purity in the cubic phase boron nitride films being achieved. The present method therefore enables the production of high quality cBN films in relatively shorter times than presently achieved with current methods, thus providing a high quality source of cubic boron nitride films for use in plating cutting tools for cutting ferrous materials and alloys and for coating applications and as a high temperature dielectric material for electronic devices.

Accordingly, it is an object of the present invention to provide a new and improved method of synthesizing cubic boron nitride films.

It is another object of the present invention to provide an improved method of synthesizing high quality cubic boron nitride films without requiring ion bombardment of the films during deposition of the films on a substrate.

It is still a further object of the present invention to provide an improved method of synthesizing cubic boron nitride films that enables the production of high quality, relatively larger crystalline cubic boron nitride films at enhanced growth rates.

It is still another object of the present invention to provide an improved method of synthesizing cubic boron nitride films from hexagonal boron nitride films using an RF sputtering method, which enables the production of substantially pure cubic boron nitride films without the use of ion bombardment.

Various other objects, features and advantages of the present invention will become known to those skilled in the art upon reading the following specification when taken in conjunction with the accompanying drawings.

DETAILED DESCRIPTION

Figure 1:
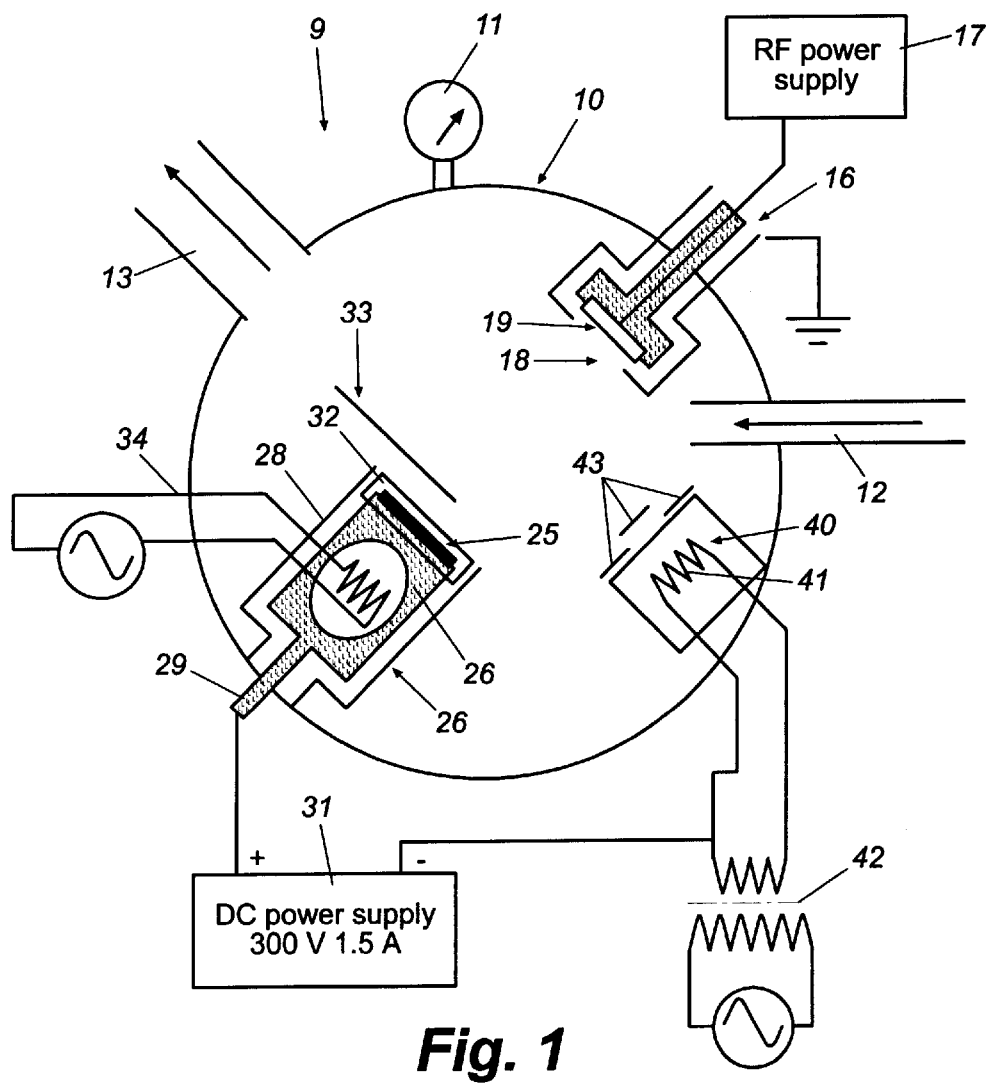
FIG. 1 is a schematic illustration of a sputtering system for performing the method of the present invention.

The present invention relates to a method of synthesizing cubic phase boron nitride films for use in forming cutting tool inserts and applying as protective coatings and insulating materials. The method of the present invention uses an RF sputtering deposition technique or process to deposit a film of boron nitride in its cubic phase on a substrate using electron instead of ion bombardment. FIG. 1 generally illustrates the sputtering system 9 for use in performing the method of the present invention. As illustrated in FIG. 1, the sputtering system 9 utilizes a vacuum chamber 10 through which nitrogen (N$_2$) gas is pumped. The N$_2$ gas generally is inert to the boron nitride material and to the substrate and prevents oxidation of the film during deposition, and is maintained at a pressure within the vacuum chamber of between approximately 1 mtorr–55 mtorr, with the pressure being monitored by a pressure gauge 11. The vacuum chamber typically comprises a 12"–14" high thermal resistant glass bell jar deposition chamber, including a gas inlet 12 and outlet 13 connected to a pump (not shown), such as a turbomolecular pump, with an automatically controlled throttle valve to maintain constant pressure throughout the deposition process, for circulating the nitrogen gas through the vacuum chamber.

An RF magnetron sputtering gun 16 is mounted within the vacuum chamber 10 and is connected to a radio frequency (RF) generator or power supply 17. The power supply 17 generally is a 0–400 watt RF power supply and supplies RF power to the magnetron sputtering gun in an excited plasma at approximately 13.56 MHz. The power to the sputtering gun can be increased to increase the sputtering rate. The magnetron sputtering gun 16 generally is a 1" sputtering gun that receives approximately 100–200 watts from the RF power supply and includes a discharge region 18 over which a target of hexagonal boron nitride ("hBN") is positioned, as indicated at 19. The hBN target is a film of hBN that is approximately 1/16"–1/4" thick, although various thicknesses of the hBN film can be used as desired and typically comprises a 1/8" thick×1" diameter disk or sheet. hBN is similar in structure to graphite and is relatively inexpensive and simple to create or manufacture under lab conditions, thus making it an excellent source for the target for the magnetron sputtering gun for supplying boron and nitrogen atoms for the process. It will also be understood that larger size or power RF magnetron sputtering guns can be used in place of a 1" sputtering gun depending on the thickness of the hBN target and the sputtering rate desired. For thicker targets, a larger sputtering gun typically is used and more power generally required. The hBN target 19 is mounted over the discharge end 18 of the RF magnetron sputtering gun 16 and is impacted with ions by the RF magnetron sputtering gun, which causes boron and nitrogen atoms of the hBN film to be discharged or sputtered into the vacuum chamber from the hBN film to provide the boron and nitrogen flux needed for deposition.

Figure 2:
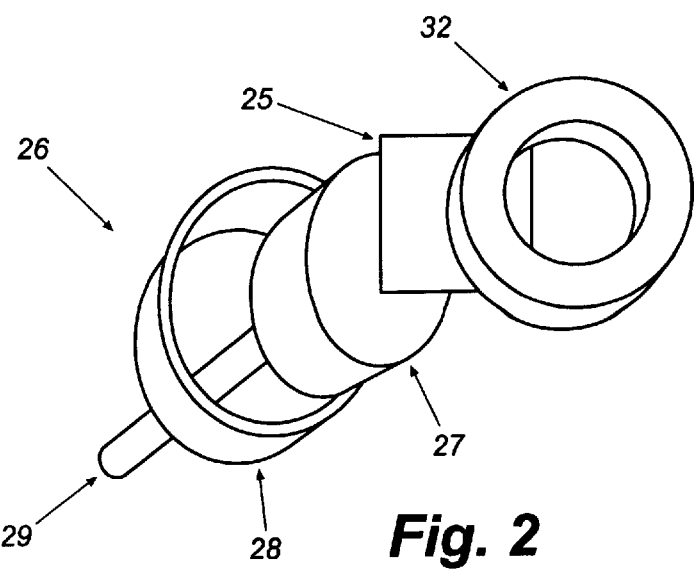
FIG. 2 is an exploded perspective view of the substrate holder of FIG. 1.

As illustrated in FIG. 1, a substrate 25 is positioned within the vacuum chamber 10 opposite and spaced from the hBN target 19. The substrate will be positioned at a distance from the hBN target sufficient to insure that the boron and nitrogen atoms being sputtered from the hBN target will be directed toward and impact the substrate without being otherwise scattered through the vacuum chamber. Typically, this distance will be approximately 5 cm, although varying other distances can be used as desired. The substrate generally is a silicon (Si) (100) wafer or sheet, such as a 4" diameter silicon wafer approximately 0.05 cm–0.25 cm in thickness, and cut into 2 cm×2 cm dies, although other, similar substrate materials also can be used, such as stainless steel, copper or other materials that can withstand the temperatures of deposition, i.e., having melting temperatures that are higher than the deposition temperatures, that generally will have been cleaned and etched in a hydrogen fluoride (HF) solution or similar solution to remove any native oxides therefrom so as to leave substantially pure silicon. As shown in FIG. 2, the substrate 25 is mounted on a shielded substrate holder 26. The substrate holder 26 includes a graphite block 27 on which the substrate 25 is positioned, with a stainless steel ground shield 28 positioned co-axially with the graphite block 27. The average space between the ground shield and the graphite block typically is approximately 2 mm–3 mm so that plasma discharge generally cannot be sustained except in front of the substrate.

A conductive rod 29 formed from copper, stainless steel or other electrically conductive material is mounted to the graphite block and connects to a DC power supply 31. The DC power supply is generally a 0–300V, approximately 1.5 amp DC power supply for supplying current to the substrate through the rod 29 at a current density of approximately 0–400 mAmp/cm² applied across the substrate for creating a positive biasing of the substrate to attract electrons thereto. A ceramic cap 32, generally formed in the shape of a ring or cylinder is applied over the substrate and the graphite block. The ceramic cap is used to block the graphite areas that are not covered by the silicon substrate so that all electron current attracted to and bombarding the substrate must first pass through the substrate.

As shown in FIG. 1, a shutter 33 is positioned adjacent the substrate holder and is movable between an open position and a closed position covering the substrate. Generally, as the deposition process is started, the shutter is in its closed position over the substrate as the chamber is put under a vacuum and the gas flow is regulated so that the hBN target can be cleaned of impurities prior to the start of the deposition process. In addition, a heater 34 (FIG. 1) can be mounted within the substrate holder as necessary for heating the substrate to a desired temperature. The heater typically can include a 1 kilowatt quartz lamp mounted adjacent the graphite block for heating the graphite block and thus the substrate to upwards of 675° C. when required, if the electron current density is not sufficient to heat the substrate to the desired temperature.

An electron emitter 40 is mounted adjacent the discharge zone 18 of the magnetron sputtering gun 16, and includes a tungsten filament 41 connected via an isolation transformer 42 to the DC power supply 31. The tungsten filament generally is approximately 0.25 mm in diameter, having approximately 15 turns, and is placed inside a 2" quartz tube. The isolation transformer 42 supplies current through the tungsten filament causing the tungsten filament to be heated.

Current from the DC power supply is passed through the tungsten filament. The current passing through the filament heats the filament, causing the filament to emit electrons into the vacuum chamber. The electrons are attracted to the positively biased silicon substrate 25 and thus impact or strike the substrate. As a result, the substrate is heated to 425–950° C. or higher temperatures as the boron and nitrogen atoms sputtered from the hBN target strike the substrate to promote the deposition or formation of cubic phase boron nitride while suppressing other, less desirable phases. Preferably, the substrate will be heated to approximately 835° C.–950° C. by the electron bombardment, and where necessary, the heater 34 also can be actuated to heat the substrate as needed.

A series of tantalum covers 43 are positioned in front of the electron emitter 40 in a slightly overlapping arrangement as illustrated in FIG. 1. The tantalum covers are not electrically connected within the chamber and thus the electrons emitted from the tungsten filament 41 generally will bounce off of the tantalum sheets and escape toward the substrate, while the tungsten atoms emitted from the tungsten filament are blocked by the tantalum sheets. It should be understood that while tantalum is used for the cover plates, any metal or ceramic that can withstand the high deposition temperatures without melting, such as stainless steel, also can be used in place of the tantalum for the covers 43.

In the method of the present invention, the hBN target is applied over the magnetron sputtering gun 16 placed within the vacuum chamber 10 and the chamber is sealed and a pumped down nitrogen gas flow started. At this point, the shutter 33 is in its closed position covering the silicon substrate 25 as the gas flow is adjusted to a desired pressure of between 1–55 mtorr, typically 7–20 mtorr, and as the sputtering gun begins to bombard the target with ions so as to clean the target of impurities prior to the start of the deposition process. Once the desired conditions are achieved within the vacuum chamber and the electron emitter is energized, the shutter is moved to its open position, exposing the silicon substrate 25. As the ions being directed at the hBN target by the magnetron sputtering gun bombard the target, the impact of the ions on the hBN target forces or sputters boron and nitrogen atoms away from the hBN target and toward the silicon substrate.

The boron and nitrogen atoms released from the hBN target impact and reform on the silicon substrate. At the same time, electrons being emitted from the hot tungsten filament of the electron emitter are attracted to the positively-biased substrate and bombard the substrate so as to heat the substrate and suppress the formation of hexagonal phase or other, less desirable phases of boron nitride. These electrons also provide energy to the boron and nitrogen atoms on the substrate causing the atoms to move and be excited to a higher state. Nitrogen molecules near the substrate are decomposed by the electrons to form atomic nitrogen ($N_2$) that is more reactive with boron. As a result, the boron and nitrogen atoms are encouraged to reform on the substrate as cubic boron nitride. In effect, the electrons disrupt the natural tendency of the boron and nitrogen atoms to form hexagonal boron nitride so that cubic boron nitride instead is formed. The heating of the substrate is dependent on the electron current with the substrate typically being heated to 425° C. to 950° C., although the substrate can also be heated to lesser or greater temperatures, such as 1000° C. or greater, as desired, depending on the current applied. The process generally is conducted for a desired time depending upon the thickness of the film desired, with the process being conducted for longer times to form thicker films, typically being run for 1–3 hours.

In experiments conducted using the method of the present invention, cubic boron nitride films were deposited having a thickness of between 90–350 nanometers at growth rates of between 5–15 nanometers per minute over a 1 to 3 hour period. The films thus formed also had extremely high quality, depending on current densities and pressures, being somewhere in the range of 90%–100% pure cBN. Thus, the present method enables efficient and fast creation of cubic boron nitride films having high qualities for use in plating cutting tools, forming cutting inserts, cutting ferrous materials, as well as for use in polishing applications and as insulating and coating materials.

EXPERIMENTAL RESULTS AND DISCUSSION

A. Substrate Pre-Treatment and Cleaning

4" dual-side polished Si (100) wafer was first cut into 2 cm×2 cm Si dies. The dies were then cleaned in the following solvent or solutions: boiling trichloroethane, ammonium hydroxide/hydrogen peroxide solution, and hydrochloric/hydrogen peroxide solution. The Si dies were then etched in HF solution to remove silicon dioxide before the deposition. No further substrate treatment was performed.

B. Deposition Parameters

The process was conducted in a vacuum chamber with 14" pyrex glass bell jar deposition chamber in nitrogen ($N_2$) gas. The distance between the substrate and the hBN target was about 5 cm for all experiments. Prior to deposition, the hBN target was sputter cleaned for 5–10 minutes in 12 mtorr $N_2$ gas, and the deposition process conducted for 1 to 3 hours. The film thickness was measured at various times by an Alpha-Step-200 measurement. The typical film thickness was 90–350 nanometers, corresponding to a growth rate of 5–15 nanometers per minute as the different experimental parameters were varied. The following table lists the major experimental parameters:

| Major Experimental Parameters | |
|---|---|
| RF power | 150–220 watts |
| Substrate temperature | 425°–950° C. |
| $N_2$ flow rate | 3–20 sccm |
| Pressure | 5–55 mtorr |
| Electron current density | 0–400 mAmp/cm$^2$ |
| Substrate bias voltage | 0–300 V |

C. BN Film Characterization Methods

Microscopic Fourier Transform Infrared (FTIR) spectroscopy is the primary analytical tool used to analyze the BN films formed using the method of the present invention. BN has several absorption bands in infrared region ranging from 700 cm$^{-1}$ (~14 μm) to 2000 cm$^{-1}$ (~5 μm). The sp$^3$-bonded cBN has the IR absorption band with peak around 1065 cm$^{-1}$, which corresponds to the reststrahlen vibration of B-N bonds. The sp$^2$-bonded BN, which includes hBN, aBN, and tBN, has two IR absorption bands. One is located around 1380 cm$^{-1}$ corresponding to the in-plane B-N bond stretch mode, another is located around 780 cm$^{-1}$ corresponding to the out-of-plane B-N-B bond bending. It is convenient to use IR spectroscopy to analyze BN films.

Figure 3:
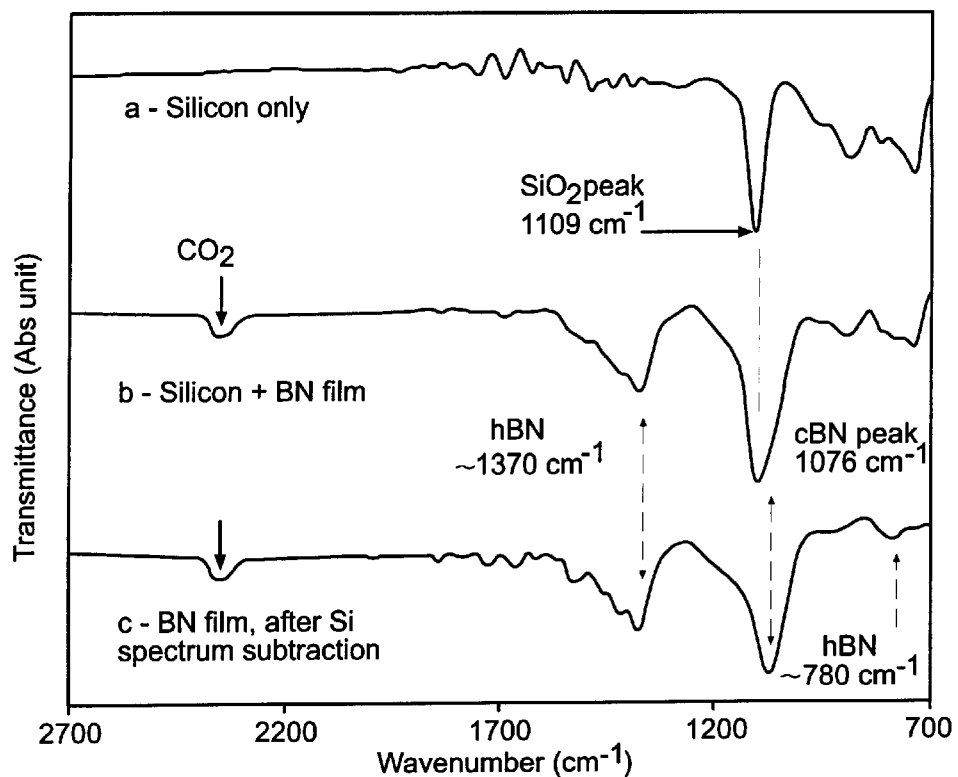
FIG. 3 is a graphic illustration of the Fourier Transform infrared (IR) spectra of the substrate and BN film deposited thereon.

Although the double-side polished Si substrate is transparent in the IR region, a thin layer of SiO$_2$ present on Si surface has a strong and sharp absorption band near 1109 cm$^{-1}$. It is necessary to subtract the substrate background absorption spectrum from the FTIR measurement before further analysis can be conducted. FIG. 3 shows three IR spectra. Line 3a shows the spectrum of a bare Si substrate with a sharp absorption band around 1109 cm$^{-1}$. Line 3b is the spectrum of Si substrate+BN film and line 3c is the spectrum of BN film after substrate background subtraction. The spectrum indicated by line 3c has three dominant peaks at 1380 cm$^{-1}$, 1070 cm$^{-1}$, and 780 cm$^{-1}$. It is clear that this BN film is a mixture of cBN and hBN. cBN content in the thin films further is measured by comparing the peak intensity ratio at approximately 1065 cm$^{-1}$ ($I_c$) and approximately 1380 cm$^{-1}$ ($I_h$). The content of cBN phase is calculated as follows:

$$cBN\% = 100 \times I_c/(I_c + I_h) \%$$

Where $I_c$ is the absorption intensity of cBN and $I_h$ is the absorption intensity of hBN.

D. Effect of Electron Current Density

Figure 4:
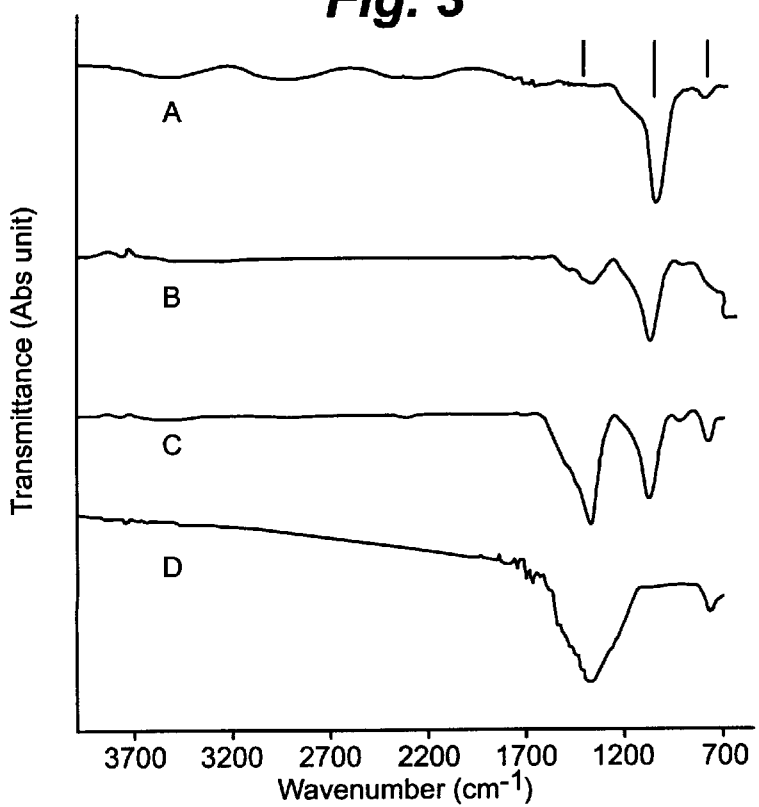
FIG. 4 is a graphic illustration of the spectra of BN films deposited at varying electron current densities.

FIG. 4 shows a series of spectra for BN films deposited at different electron current densities. The relative absorption intensity $I_c/I_h$ increases with the current density. The IR spectrum D, corresponding to a BN film deposited without electron bombardment, only shows two hBN absorption peaks around 1380 cm$^{-1}$ and 780 cm$_{-1}$. IR spectra of B and C have three absorption peaks, 1380 cm$^{-1}$ (hBN), 780 cm$^{-1}$ (hBN), and 1070 cm$^1$ (cBN). The film B, which was deposited with 75 mAmp/cm$^2$ electron current density, shows higher $I_c/I_h$ ratio than film C that was deposited with only 25 mAmp/cm$^2$ electron current density. Curve A is a BN film deposited with 140 mAmp/cm$^2$ electron current density. The cBN peak around 1070 cm$^{-1}$ is the main absorption band in spectrum A and hBN band around 1370 cm$^{-1}$ disappears in the base line. In coincidence with other research groups, the cBN peak tends to shift to higher frequency in comparison with that of bulk cBN. For most cBN films prepared by this method, cBN peaks fall in the range of 1060 to 1080 cm$^{-1}$. The up-shift of the IR absorption band usually indicates the presence of compressive stress in thin film.

Figure 5:
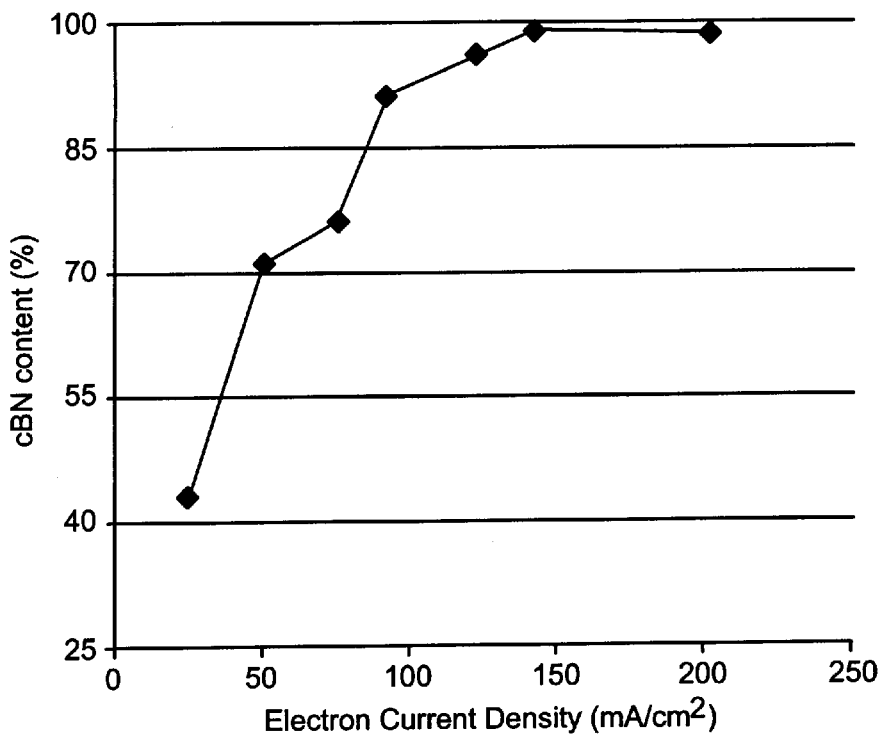
FIG. 5 is a graphic illustration of the cBN content of the boron nitride film deposited on the substrate in relation to electron current density.

FIG. 5 shows the dependence of cBN fraction in the deposited BN films on electron current density. All these films are deposited under the following conditions: 7–9 mtorr pure $N_2$ and 785°–910° C. substrate temperature. Electron current density from 0–200 mAmp/cm$^2$ has been investigated. The fraction of cBN phase increases with electron current density. When the electron current density exceeds 140 mA/cm$^2$, BN films contain>95% of cBN phase. Unlike ion assisted processes the momentum transfer from light electrons to heavy surface atoms is so inefficient that a rather wide process window exists for the electron-assisted deposition of cBN film. Net film deposition can be observed at electron current as high as 400 mAmp/cm$^2$.

E. Effect of $N_2$ Pressure

Figure 6:
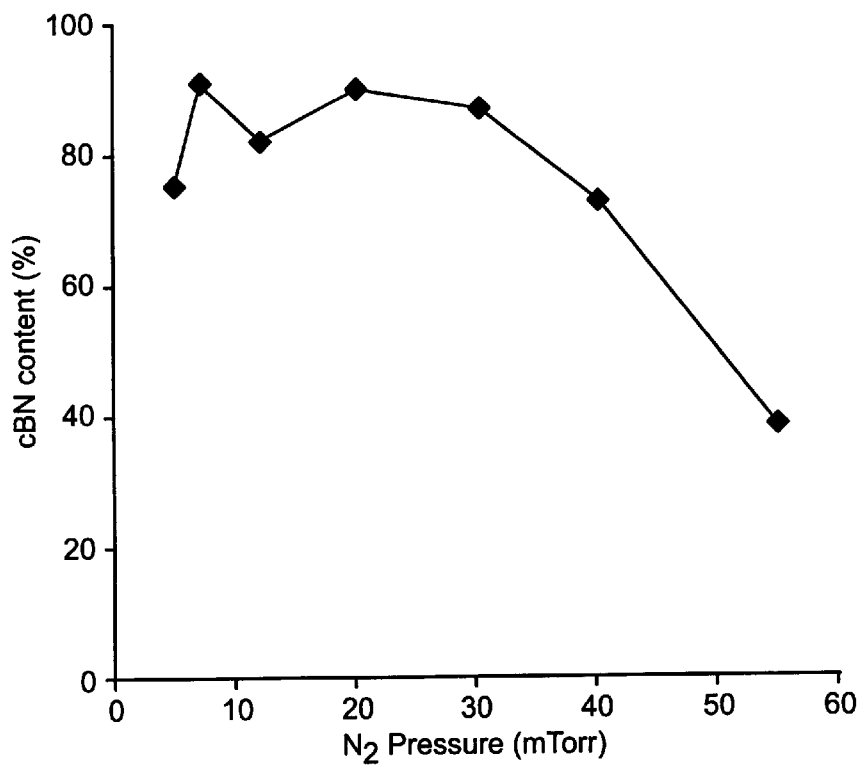
FIG. 6 is a graphic illustration of the cBN content of the boron nitride film deposited on the substrate in relation to the pressure of the nitrogen gas within the vacuum chamber.

FIG. 6 shows the relationship between $N_2$ pressure and the content of cBN phase in BN films. All films are deposited with 140–170 mAmp/cm$^2$ electron current density. In the pressure region lower than 5 mtorr, the sputtering rate drops quickly and hardly any deposition was observed on the substrate. When $N_2$ pressure exceeds 30 mtorr, the cBN content begins to decrease with increasing pressure. The optimal pressure window for sputter deposition of cBN thus has been found to be from 7–20 mtorr. One possible explanation for this phenomenon is the decreasing of bombarding electron energy at high pressure. At relatively high pressures (approximately 50 mtorr), electrons may undergo non-negligible collisions while the mean free path is relatively short. Most electrons are no longer able to accumulate enough energy to initialize the cBN formation when they bombard the substrate surface. The most obvious evidence of reduced mean free path is the size of glow at the anode, the substrate in this case. At approximately 7 mtorr, anode glow almost extended from substrate to electron emitter. When the pressure increased to approximately 50 mtorr, anode glow was limited within few millimeters from the substrate.

F. Effect of Substrate Temperature

Figure 7:
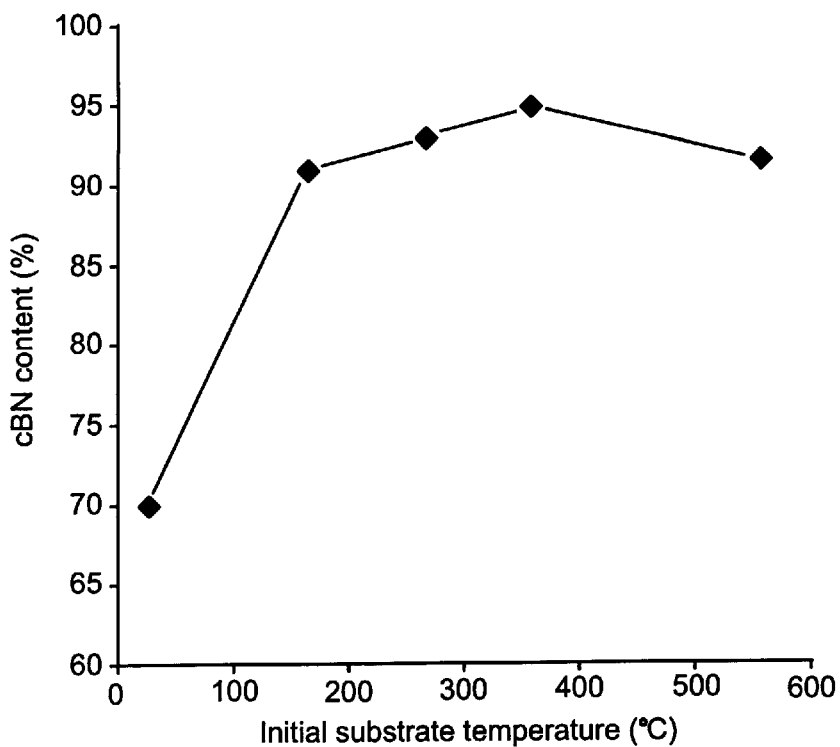
FIG. 7 is a graphic illustration of the cBN content of the boron nitride film deposited on the substrate in relation to the initial substrate temperature.
Figure 8:
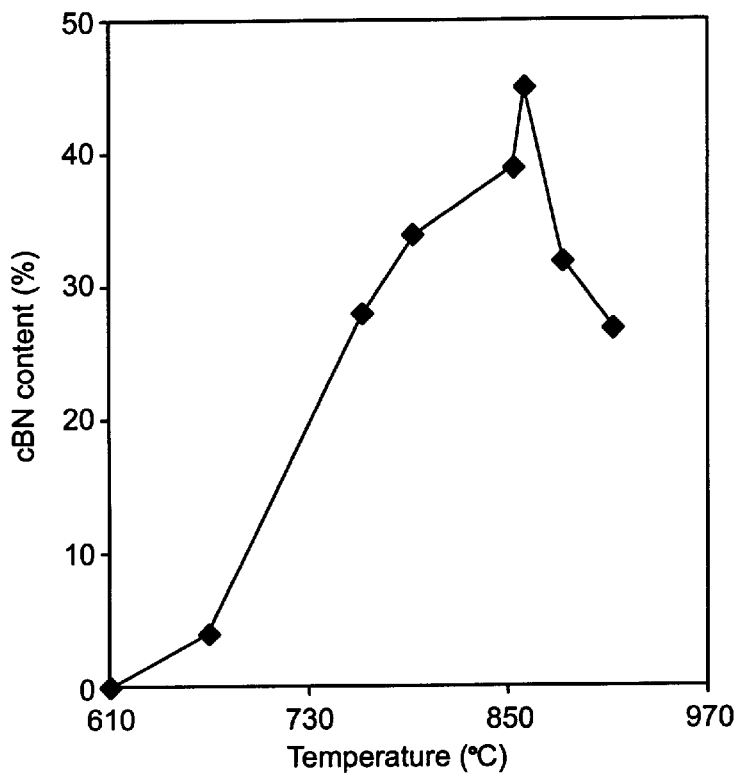
FIG. 8 is a graphic illustration of the CBN content of the boron nitride film deposited on the substrate in relation to the temperature.

The heating of the substrate by electron current is significant. An electron current density of 450 mA/cm$^2$ can heat the substrate to above 850° C. within a few seconds. However the substrate holder remains at lower temperatures typically less than 800° C. In a typical experiment, the substrate was pre-heated to the desired initial substrate temperature $T_{sub}$ before the electron bombardment began. The electron current then heats the substrate to 785°–910° C. in a few seconds. To investigate the effect of the initial substrate temperature, several films were deposited with the same electron current density and pressure conditions (170 mAmp/cm$^2$ and 7 mtorr), with the initial substrate temperature ($T_{sub}$) of each being varied. Most of the BN films contained more than 90% cBN, as illustrated in FIG. 7. Only the sample with initial $T_{sub}$<100° C. showed a significant decrease in cBN content (approximately 70%).

G. Conclusions

The present invention thus provides an electron assisted RF magnetron sputtering technique for promoting the deposition or formation of boron nitride films in a cubic phase. When the electron current density exceeds 140 mA/cm$^2$, BN films with >95% cBN phase were obtained at the substrate temperature of approximately 835° C.–950° C. Deposition pressures ranging from 1 to 50 mtorr have been investigated. The optimal processing pressure was found to be 7–20 mtorr (FIG. 6).

By using electrons instead of ions to bombard the substrate during cBN deposition, the present method provides several advantages in comparison with the ion assisted processes. A first advantage is the extended processing pressure range of up to 50 mtorr or greater. For ion assisted processes, ions must be allowed to travel from the ion source to the substrate with few collisions. In a normal ion plating deposition system with a Kaufman-type broad ion beam source, the distance between the ion source and the substrate is at least 10 cm or larger. To make sure that most ions extracted from the ion source can be used for substrate bombardment, the mean free path must be larger than the ion source-substrate distance (>10 cm). This requirement thus restricts the operation pressure for ion-assisted processes to be approximately 5×10$^{-4}$ torr or lower. At higher pressures of >1 mtorr, the mean free path λ is so short that energetic ions lose their energies rapidly by frequent collisions. In addition, the charge exchanges between ions and background neutrals are also increased dramatically. For typical processing gases, i.e., Ar or N$_2$, the mean free path at 1 mtorr is on the order of several centimeters. For the present invention, the limitation of operating pressure is relaxed by the less energy loss per elastic collision between electrons and neutral gas particles. In comparing with ions, the size and the collision cross-section of electrons are much smaller. Electrons can fly over a longer distance before they collide with neutrals. In the event of collisions, instead of being eliminated, more secondary electrons can be created by ionization impacts.

A second advantage is the minimized re-sputtering effect. The mass of impinging ions in an ion plating process is on the same order as that of atoms on the growing surface. Since momentum transfer is most efficient between two particles with similar masses, re-sputtering, which is tightly related to the momentum transfer phenomenon, is significant in the ion-plating process. The re-sputtering rate rises quickly as the ion current and ion energy increase. At certain ion current densities, re-sputtering becomes the dominant process leading to negligible or no film growth. For cBN film deposition, the ion energy needed for the formation of the cubic BN phase is close to that for re-sputtering. The processing window is thus very narrow. In contrast, electrons as used in the present invention are so light that the momentum transfer is negligible in most cases.

A third advantage of the present invention is the formation of high density plasma adjacent to the growing surface. In addition, the hot filament electron emitter is capable of emitting high electron current and a large number of electrons are available to ionize and dissociate the gas molecules near the substrate. High concentrations of radicals and activated species therefore are readily available for film growth.

It will be understood by those skilled in the art that while the present invention has been disclosed with reference to a preferred embodiment described above, various modifications, additions and changes can be made thereto without departing from the spirit and scope of the present invention as set forth in the following claims.

What is claimed is:

1. A method of forming cubic phase boron nitride films, comprising:
    impacting a target of hexagonal boron nitride with ions;
    sputtering atoms of boron and nitrogen away from the target of hexagonal boron nitride and toward a substrate;
    emitting electrons from an electron emitter by passing a current through a filament sufficient to cause electrons to be released from the filament; and
    impacting the substrate with the electrons at sufficiently high current density as the boron and nitrogen atoms are deposited on the substrate to heat the substrate and excite the boron and nitrogen atoms on the substrate so as to cause the boron and nitrogen atoms to be reformed on the substrate as a cubic phase boron nitride film.

2. The method of claim 1 and further comprising the step of positively biasing the substrate to attract the electrons to the substrate.

3. The method of claim 1 and wherein the step of impacting a target of hexagonal boron nitride with ions comprises positioning the target of hexagonal boron nitride over a discharge region of an RF magnetron sputtering gun, and applying ions to the target with the sputtering gun.

4. The method of claim 1 and further including the step of passing a current through the substrate at a current density of between approximately 0–400 mAmp/cm$^2$ to attract electrons to the substrate.

5. The method of claim 1 and further including sputtering the atoms of boron and nitrogen away from the target for an initial time prior to emitting electrons and with the substrate covered for cleaning the hexagonal boron nitride target of impurities prior to commencing deposition of the boron and nitrogen atoms on the substrate.

6. A method of forming cubic phase boron nitride films, comprising:
    placing a substrate and a target of hexagonal boron nitride within a deposition chamber, spaced from one another;
    directing ions at the target of hexagonal boron nitride to cause atoms of boron and nitrogen to be sputtered from the target;
    impacting the substrate with the boron and nitrogen atoms sputtered from the target, passing a current through a filament sufficient to cause electrons to be released from the filament; and emitting the electrons into the deposition chamber, directed toward the substrate at a sufficient current density as the boron and nitrogen atoms strike the substrate so as to excite the boron and nitrogen atoms collecting on the substrate to promote the formation of cubic phase boron nitride film on the substrate.

7. The method of claim 6 and further including covering the substrate as ions initially are directed at the target of hexagonal boron nitride prior to emitting electrons into the deposition chamber for cleaning the target of impurities.

8. The method of claim 6 and where the step of placing a substrate within the deposition chamber comprises positioning the substrate adjacent the target at a sufficient distance such that the boron and nitrogen atoms sputtered from the target are substantially directed toward and impact the substrate.

9. The method of claim 6 and further including applying a current to the substrate to create a positive biasing for attracting the electrons emitted into the deposition chamber thereto.

10. The method of claim 6 and wherein as the electrons impact the substrate, heating the substrate and exciting the nitrogen atoms collecting on the substrate to a higher state that is more reactive with boron to promote formation of the boron and nitrogen atoms on the substrate in the cubic phase.

11. The method of claim 10 and wherein the substrate is heated to between approximately 425°–950° C.

12. The method of claim 6 and further including supplying a flow of nitrogen gas to the deposition chamber at a pressure of between approximately 1 to 55 mtorr.

13. The method of claim 6 and wherein the step of directing ions at the substrate comprises positioning the target adjacent an RF magnetron sputtering gun, supplying a flow of ions in an excited plasma through the sputtering gun and directing the ions against the target to cause the boron and nitrogen atoms to be sputtered from the target.

* * * * *

UNITED STATES PATENT AND TRADEMARK OFFICE
CERTIFICATE OF CORRECTION

PATENT NO. : 6,153,061 B1  
DATED : November 28, 2001  
INVENTOR(S) : Tzeng et al.

Page 1 of 1

It is certified that error appears in the above-identified patent and that said Letters Patent is hereby corrected as shown below:

Column 1,  
Line 10, insert:  
-- The U.S. Government has a paid-up license in this invention and the right in limited circumstances to require the patent owner to license others on reasonable terms as provided for by the terms of NCCW-0057 awarded by National Aeronautic and Space Administration (NASA) and by the terms of SUB94-189 awarded by the University of Alabama at Huntsville under the above contract. --

Signed and Sealed this

Twelfth Day of March, 2002

Attest:

Attesting Officer

JAMES E. ROGAN  
Director of the United States Patent and Trademark Office